US011143709B2

(12) United States Patent
Delobel et al.

(10) Patent No.: US 11,143,709 B2
(45) Date of Patent: Oct. 12, 2021

(54) METHOD FOR ESTIMATING THE STATE OF HEALTH OF AN ELECTROCHEMICAL CELL FOR STORING ELECTRICAL ENERGY

(71) Applicant: RENAULT s.a.s., Boulogne-billancourt (FR)

(72) Inventors: Bruno Delobel, Issy les Moulineaux (FR); Antoine Saint-Marcoux, Palaiseau (FR)

(73) Assignee: RENAULT s.a.s., Boulogne-billancourt (FR)

( * ) Notice: Subject to any disclaimer, the term of this patent is extended or adjusted under 35 U.S.C. 154(b) by 927 days.

(21) Appl. No.: 14/895,565

(22) PCT Filed: May 26, 2014

(86) PCT No.: PCT/FR2014/051228
§ 371 (c)(1),
(2) Date: Feb. 11, 2016

(87) PCT Pub. No.: WO2014/195606
PCT Pub. Date: Dec. 11, 2014

(65) Prior Publication Data
US 2016/0154063 A1 Jun. 2, 2016

(30) Foreign Application Priority Data

Jun. 4, 2013 (FR) ........................................ 1355092

(51) Int. Cl.
*G01R 31/36* (2020.01)
*G01R 31/392* (2019.01)
(Continued)

(52) U.S. Cl.
CPC .......... *G01R 31/392* (2019.01); *G01R 31/367* (2019.01); *G01R 31/389* (2019.01); *G01R 31/3835* (2019.01); *G01R 31/396* (2019.01)

(58) Field of Classification Search
CPC .. G01R 31/3606–3696; G01R 31/3679; G01R 31/3651; G01R 31/3662; G01R 31/362; G01R 31/3658
See application file for complete search history.

(56) References Cited

U.S. PATENT DOCUMENTS 5,049,803 A * 9/1991 Palanisamy ........ G01R 31/3624
320/132
5,160,880 A * 11/1992 Palanisamy ........ G01R 31/3624
320/106
(Continued)

FOREIGN PATENT DOCUMENTS

| FR | 3006450 A1 * 12/2014 | ........ G01R 31/3651 |
|---|---|---|
| JP | 07046117 A * 2/1995 | |
| WO | WO 2011/050924 A1 5/2011 | |

OTHER PUBLICATIONS

Roscher et al; "Reliable State Estimation of Multicell Lithium-Ion Battery Systems"; IEEE Transactions on Energy Conversion, vol. 26, No. 3, Sep. 2011 (Year: 2011).*
(Continued)

*Primary Examiner* — Catherine T. Rastovski
*Assistant Examiner* — Leonard S Liang
(74) *Attorney, Agent, or Firm* — Oblon, McClelland, Maier & Neustadt, L.L.P.

(57) ABSTRACT

A method for estimating a state of health of an electrochemical cell for storing electrical energy includes applying at least one current strength peak to the cell, the current peak passing through the cell, measuring a variation, as a function of a time t elapsed after the application of the current peak, of voltage U at the terminals of the cell, and calculating at
(Continued)

Figure 1:
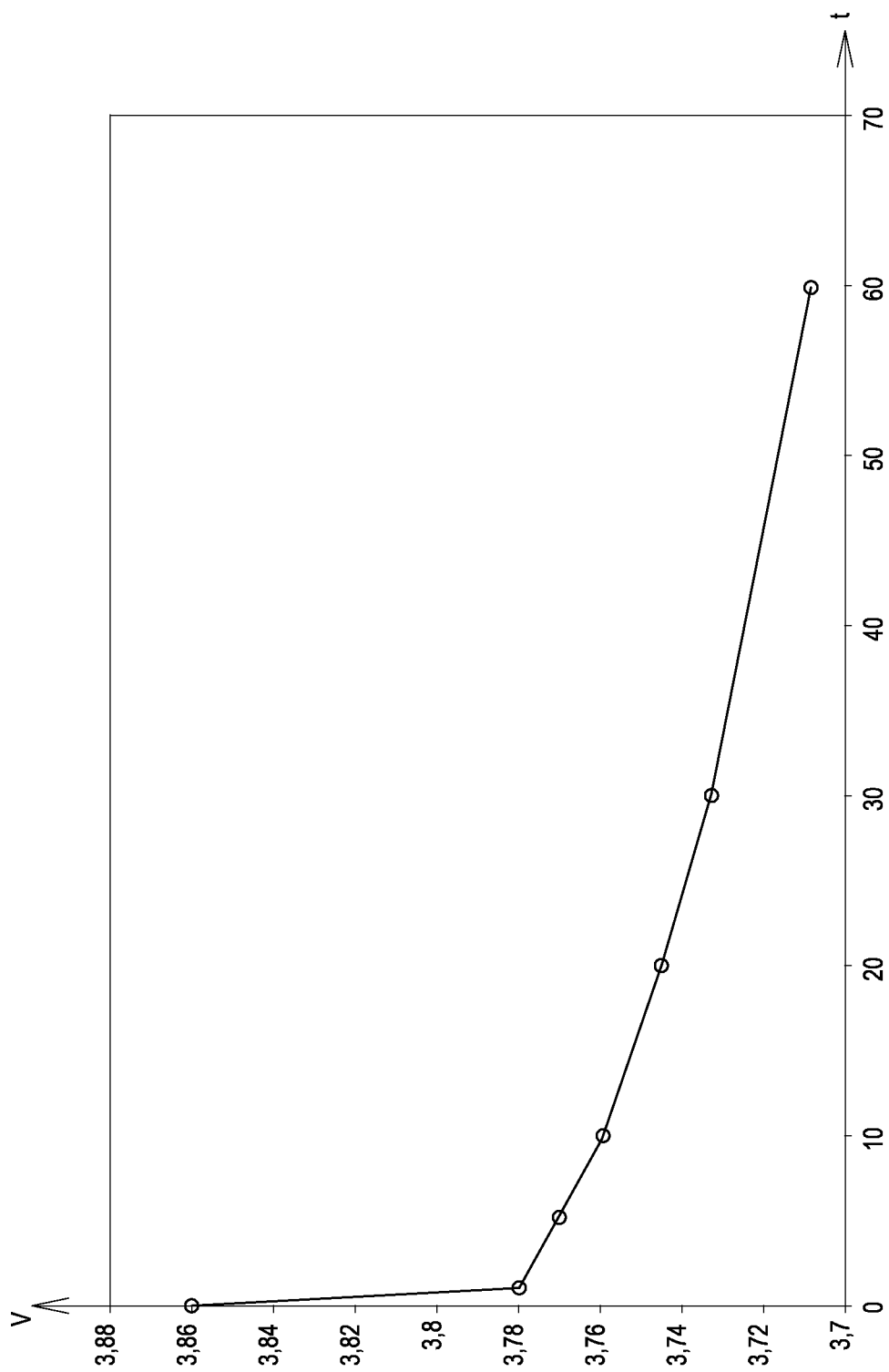

least one coefficient $\alpha_{I_1}$ and at least one coefficient $U_{0,I_1}$ such that the function $\sqrt{t} \to \alpha_{I_1} \times \sqrt{t} + U_{0,I_1}$ is a linear approximation of the variation of the voltage U as a function of $\sqrt{t}$ for $\sqrt{t} \geq C$, where C>0. The method is used in electrical or hybrid vehicles.

8 Claims, 9 Drawing Sheets

(51) Int. Cl.
  *G01R 31/367* (2019.01)
  *G01R 31/389* (2019.01)
  *G01R 31/396* (2019.01)
  *G01R 31/3835* (2019.01)

(56) References Cited

U.S. PATENT DOCUMENTS

| | | | | |
|---|---|---|---|---|
| 5,617,324 | A * | 4/1997 | Arai | G01R 31/3648 702/63 |
| 5,703,486 | A * | 12/1997 | Arai | G01R 31/3828 324/427 |
| 6,160,382 | A * | 12/2000 | Yoon | G01R 31/3651 320/134 |
| 6,310,462 | B1 * | 10/2001 | Arai | G01R 31/3842 320/132 |
| 6,653,817 | B2 * | 11/2003 | Tate, Jr. | G01R 31/389 320/132 |
| 7,567,086 | B2 * | 7/2009 | Salman | G01N 27/045 324/426 |
| 7,899,631 | B2 * | 3/2011 | Iwane | G01R 31/3651 320/149 |
| 8,487,628 | B2 * | 7/2013 | Sciarretta | G01R 31/367 324/426 |
| 9,121,911 | B2 * | 9/2015 | Takahashi | H01M 10/0525 |
| 2002/0186019 | A1 * | 12/2002 | Arai | G01R 31/389 324/525 |
| 2002/0196027 | A1 | 12/2002 | Tate, Jr. et al. | |
| 2003/0025507 | A1 * | 2/2003 | Arai | G01R 31/389 324/427 |
| 2003/0067282 | A1 * | 4/2003 | Arai | G01R 31/389 320/132 |
| 2003/0206021 | A1 * | 11/2003 | Laletin | G01R 31/386 324/426 |
| 2004/0095143 | A1 * | 5/2004 | Laig-Hoerstebrock | G01R 31/3624 324/426 |
| 2004/0162683 | A1 * | 8/2004 | Verbrugge | G01R 31/361 702/64 |
| 2004/0232884 | A1 * | 11/2004 | Vaillancourt | H02J 7/0047 320/132 |
| 2005/0001627 | A1 * | 1/2005 | Anbuky | G01R 31/3651 324/427 |
| 2006/0181245 | A1 * | 8/2006 | Mizuno | G01R 31/367 320/132 |
| 2006/0276980 | A1 * | 12/2006 | Mizuno | G01R 31/361 702/63 |
| 2007/0096743 | A1 * | 5/2007 | Arai | G01R 31/392 324/426 |
| 2008/0065336 | A1 * | 3/2008 | Seo | G01R 19/16542 702/63 |
| 2008/0120050 | A1 * | 5/2008 | Iwane | G01R 31/3679 702/63 |
| 2008/0204031 | A1 * | 8/2008 | Iwane | G01R 31/3624 324/430 |
| 2008/0243405 | A1 * | 10/2008 | Iwane | G01R 31/362 702/63 |
| 2010/0085057 | A1 * | 4/2010 | Nishi | H01M 10/44 324/427 |
| 2010/0090650 | A1 * | 4/2010 | Yazami | H01M 10/443 320/132 |
| 2010/0198536 | A1 * | 8/2010 | Hess | G01R 31/3624 702/63 |
| 2010/0324848 | A1 * | 12/2010 | Cho | B60L 3/0046 702/63 |
| 2011/0054816 | A1 * | 3/2011 | Prada | G01R 31/367 702/63 |
| 2011/0060538 | A1 * | 3/2011 | Fahimi | G01R 31/3679 702/63 |
| 2011/0264381 | A1 * | 10/2011 | Gering | H01M 10/48 702/32 |
| 2011/0309838 | A1 * | 12/2011 | Lin | G01R 31/3624 324/427 |
| 2012/0265397 | A1 | 10/2012 | Aliberti et al. | |
| 2012/0266431 | A1 * | 10/2012 | Hahn | G01R 31/3644 29/407.05 |
| 2012/0310565 | A1 | 12/2012 | Redey | |
| 2013/0069660 | A1 * | 3/2013 | Bernard | G01R 31/3651 324/430 |
| 2013/0138369 | A1 * | 5/2013 | Papana | G01R 31/3644 702/63 |
| 2013/0169234 | A1 * | 7/2013 | Chuah | H01M 10/44 320/136 |
| 2013/0320989 | A1 * | 12/2013 | Inoue | G01R 31/3624 324/427 |
| 2013/0342212 | A1 * | 12/2013 | Kawahira | G01R 31/362 324/433 |
| 2014/0117970 | A1 * | 5/2014 | Kitagaki | H02J 1/10 323/318 |
| 2014/0278169 | A1 * | 9/2014 | Kim | G01R 31/362 702/63 |
| 2014/0350877 | A1 * | 11/2014 | Chow | G01R 31/367 702/63 |
| 2015/0293183 | A1 * | 10/2015 | Tenmyo | H01M 10/48 324/429 |
| 2015/0369875 | A1 * | 12/2015 | Ishii | H02J 7/007 702/63 |
| 2015/0377974 | A1 * | 12/2015 | Choi | G01R 31/3651 702/63 |
| 2016/0116542 | A1 * | 4/2016 | Baba | B60L 58/12 702/63 |
| 2016/0131715 | A1 * | 5/2016 | Sung | G01R 31/3651 702/63 |
| 2016/0187432 | A1 * | 6/2016 | Saint-Marcoux | G01R 31/392 702/63 |
| 2016/0291094 | A1 * | 10/2016 | Gagneur | G01R 31/3648 |
| 2017/0212170 | A1 * | 7/2017 | Torai | H01M 10/4285 |

OTHER PUBLICATIONS

Roscher, Michael A.—"Reliable State Estimation of Multicell Lithium-Ion Battery Systems"; IEEE Transactions on Energy Conversion, vol. 26, No. 3, Sep. 2011. (Year: 2011).*
International Search Report dated Jul. 21, 2014 in PCT/FR2014/051228.
Preliminary French Search Report dated Mar. 28, 2014 in Patent Application No. 1355092.
Y. Hu, et al., "A technique for dynamic battery model identification in automotive applications using linear parameter varying structures" Control Engineering Practice, vol. 17, No. 10, XP026496900, 2009, pp. 1190-1201.
Stanislav Tairov, et al., "Impedance Measurements for Battery State of Health Monitoring" 2011 2nd International Conference on Control, Instrumentation and Automation (ICCIA), IEEE, XP032268132, 2011, pp. 79-83.
Kuei-Hsiang Chao, et al., "State-of-health estimator based-on extension theory with a learning mechanism for lead-acid batteries" Expert Systems with Applications, vol. 38, No. 12, XP028268655, 2011, pp. 15183-15193.

(56) References Cited

OTHER PUBLICATIONS

Jonghoon Kim, et al., "State-of-Charge Estimation and State-of-Health Prediction of a Li-Ion Degraded Battery Based on an EKF Combined With a Per-Unit System" IEEE Transactions on Vehicular Technology, vol. 60, No. 9, XP011388447, Nov. 2011, pp. 4249-4260.

* cited by examiner

METHOD FOR ESTIMATING THE STATE OF HEALTH OF AN ELECTROCHEMICAL CELL FOR STORING ELECTRICAL ENERGY

The present invention relates to a method for estimating the state of health of an electrochemical cell for storing electrical energy. It is notably, but not exclusively, applicable to electric or hybrid automobile vehicles.

In the current context of consensus around climate change and global warming, the reduction in emissions of carbon dioxide ($CO_2$) is a major challenge with which the automobile manufacturers are confronted, the standards being ever more demanding in this regard.

Aside from the continuous improvement in the efficiencies of conventional thermal engines, which is accompanied by a reduction in the emissions of $CO_2$, electric vehicles (or EVs) and hybrid thermo-electric vehicles (or HEVs) are today considered as the most promising solution for reducing $CO_2$ emissions.

Various technologies for the storage of electrical energy have been tested in recent years in order to meet the needs of EVs. It turns out today that the batteries using lithium-ion (Li-ion) cells are those that allow the best compromise to be obtained between power density, which favors the performance notably in terms of acceleration, and the energy density, which favors the autonomy.

Unfortunately, the power density and the energy density decrease throughout the lifetime of the battery, notably under the effect of variations in temperature. Thus, after a sufficiently long time of use, an EV may exhibit degraded performance characteristics in terms of autonomy and/or power. This degradation should be controlled in order to maintain sufficient levels of service and of safety.

In order to quantify this degradation, an indicator called "State of Health" (or SOH) has been defined, which is the ratio of the current capacity of a battery with respect to its initial capacity at the beginning of life. Estimating the SOH based on the estimation by impedance measurement of the internal resistance of the battery (or DCR for "Direct Current Resistance") is known notably from the U.S. Pat. No. 6,653,817. Since the internal resistance of a battery characterizes the variation of the voltage U across the terminals of the battery for a certain variation in the intensity I of the current flowing through the battery, the idea of this patent is a precise control of the variation of the intensity I flowing through the battery and a measurement of the variation of the voltage U across the terminals of the battery. One major drawback of this solution is that, if the measurement of voltage is not precise, notably in the case of transient noise signals, the estimation of the resistance may be impacted and the estimation of the SOH may be inaccurate. This is one of the problems to which the present invention aims to provide a solution.

The aim of the invention is notably to solve the aforementioned drawbacks, notably to avoid the measurement problems, by linearizing the measurement of the internal resistance. For this purpose, the subject of the invention is a method for estimating the state of health of an electrochemical cell for storing electrical energy. It comprises a step for applying to the cell at least one current peak of intensity $I_1$, the current peak flowing through the cell. It also comprises a step for measuring the variation, as a function of the time t that has passed after the application of the current peak, of the voltage U across the terminals of the cell. It also comprises a step for calculating at least one coefficient $\alpha_{I_1}$ and at least one coefficient $U_{0,I_1}$ such that the function $\sqrt{t} \to \alpha_{I_1} \times \sqrt{t} + U_{0,I_1}$ is a linear approximation of the variation of the voltage U as a function of $\sqrt{t}$ for $\sqrt{t} \geq C$, where $C>0$.

In one embodiment, the coefficients $\alpha_{I_1}$ and $U_{0,I_1}$ may be calculated a first time at the beginning of life of the cell. The method may then comprise a step for calculating the ratio of the value currently calculated of $\alpha_{I_1}$ with respect to its value calculated at the beginning of life, where an increase in the coefficient $\alpha_{I_1}$ beyond a predetermined value can indicate an incapacity of the cell to deliver a current in its highest ranges of power. The method may also comprise a step for calculating the ratio of the value currently calculated of $U_{0,I_1}$ with respect to its value calculated at the beginning of life, where an increase in the coefficient $U_{0,I_1}$ beyond a predetermined value can indicate an incapacity of the cell to deliver a current in its highest ranges of power.

In another embodiment, tables or graphs of aging may be filled out beforehand. The method can then comprise a step for comparing the value currently calculated of $\alpha_{I_1}$ with values contained in a table or a graph of aging associating levels of aging with values of $\alpha_{I_1}$, in such a manner as to deduce the level of aging of the cell. The method may also comprise a step for comparing the value currently calculated of $U_{0,I_1}$ with values contained in a table or a graph of aging associating levels of aging with values of $U_{0,I_1}$, in such a manner as to deduce the level of aging of the cell.

In one preferred embodiment, a plurality of current peaks of intensities $(I_n)_{n \geq 2}$ can be applied to the cell ($I_1$, $I_2$, $I_3$, $I_4$, $I_5$). The method can then comprise a step for calculating a coefficient $\beta$ such that the function $I \to \beta \times I$ is a linear approximation of the variation of $\Delta U/\sqrt{t}$ as a function of I.

In another embodiment, the coefficient $\beta$ may be calculated a first time at the beginning of life of the cell. The method may then comprise a step for calculating the ratio of the value currently calculated of $\beta$ with respect to its value calculated at the beginning of life, where an increase in the coefficient $\beta$ beyond a predetermined value can indicate an incapacity of the cell to deliver a current in its highest ranges of power.

In another preferred embodiment, tables or graphs of aging may be filled out beforehand. The method may then comprise a step for comparing the value currently calculated of $\beta$ with values contained in a table or a graph of aging associating levels of aging with values of $\beta$, in such a manner as to deduce the level of aging of the cell.

In one preferred embodiment, the method may comprise a step for calculating a coefficient $\gamma$ such that the function $I \to \gamma \times I + OCV$, where OCV is the open circuit voltage of the cell, is a linear approximation of the variation of $U_{0,I}$ as a function of I.

In one embodiment, the coefficient $\gamma$ may be calculated a first time at the beginning of life of the cell. The method may then comprise a step for calculating the ratio of the value currently calculated of $\gamma$ with respect to its value calculated at the beginning of life, where an increase in the coefficient $\gamma$ beyond a predetermined value can indicate an incapacity of the cell to deliver a current in its highest ranges of power.

In one preferred embodiment, tables or graphs of aging may be filled out beforehand. The method may then comprise a step for comparing the value currently calculated of $\gamma$ with values contained in a table or a graph of aging associating levels of aging with values of $\gamma$, in such a manner as to deduce the level of aging of the cell.

One of the main advantages of the present invention is also that it only requires the software updating of the current devices for estimation of the state of health of a battery.

Figure 2:
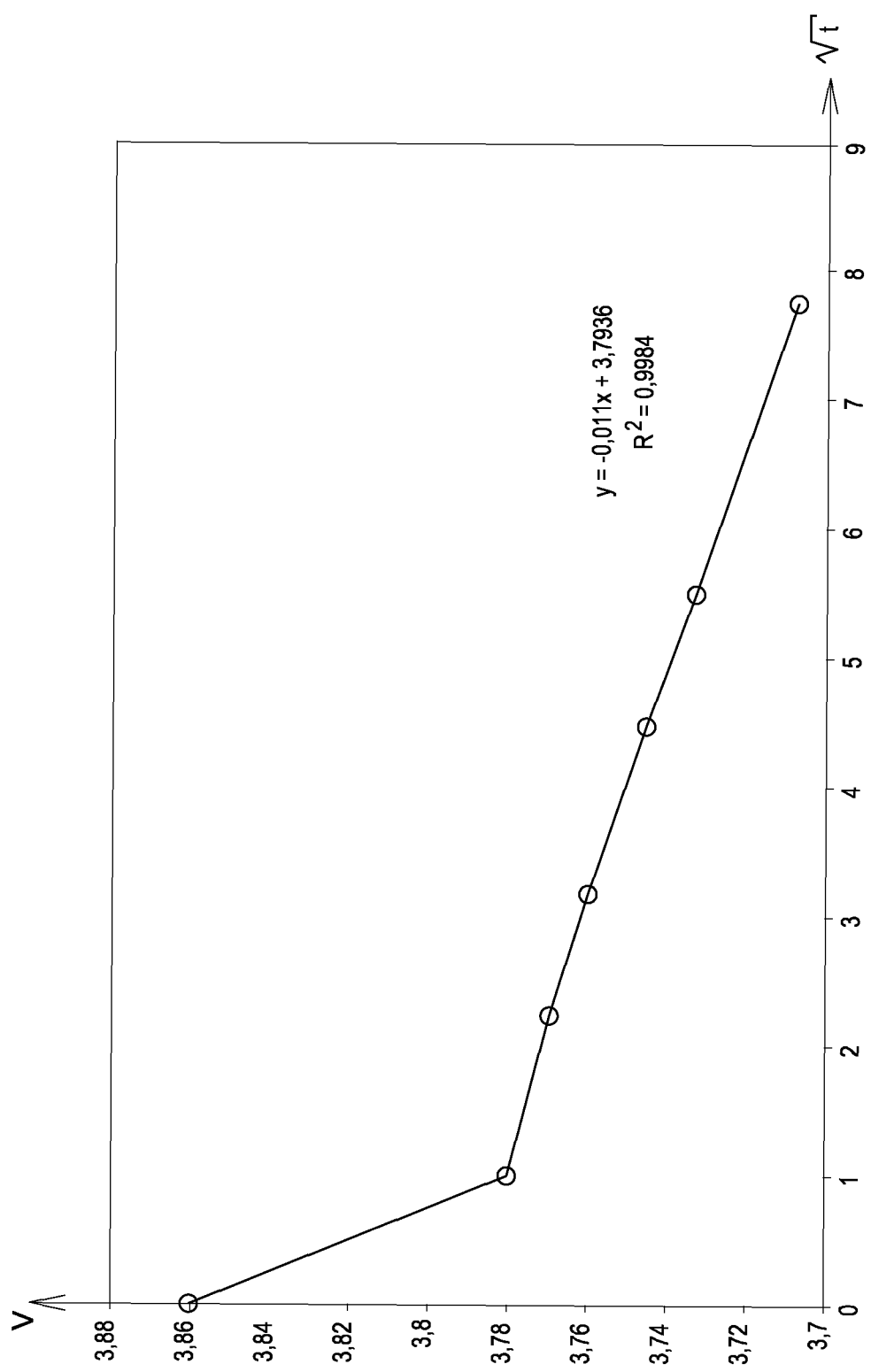
Figure 3:
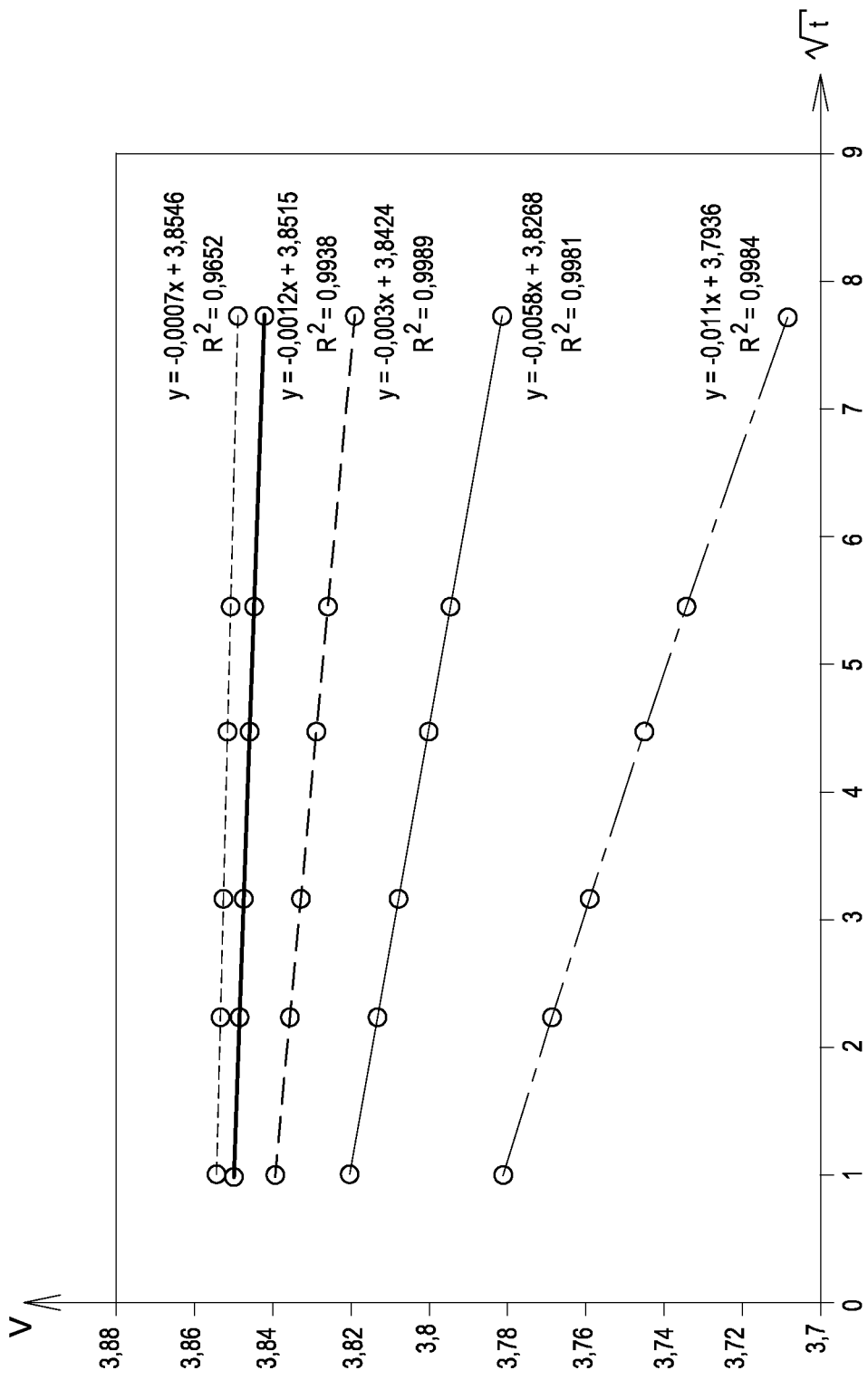
Figure 4:
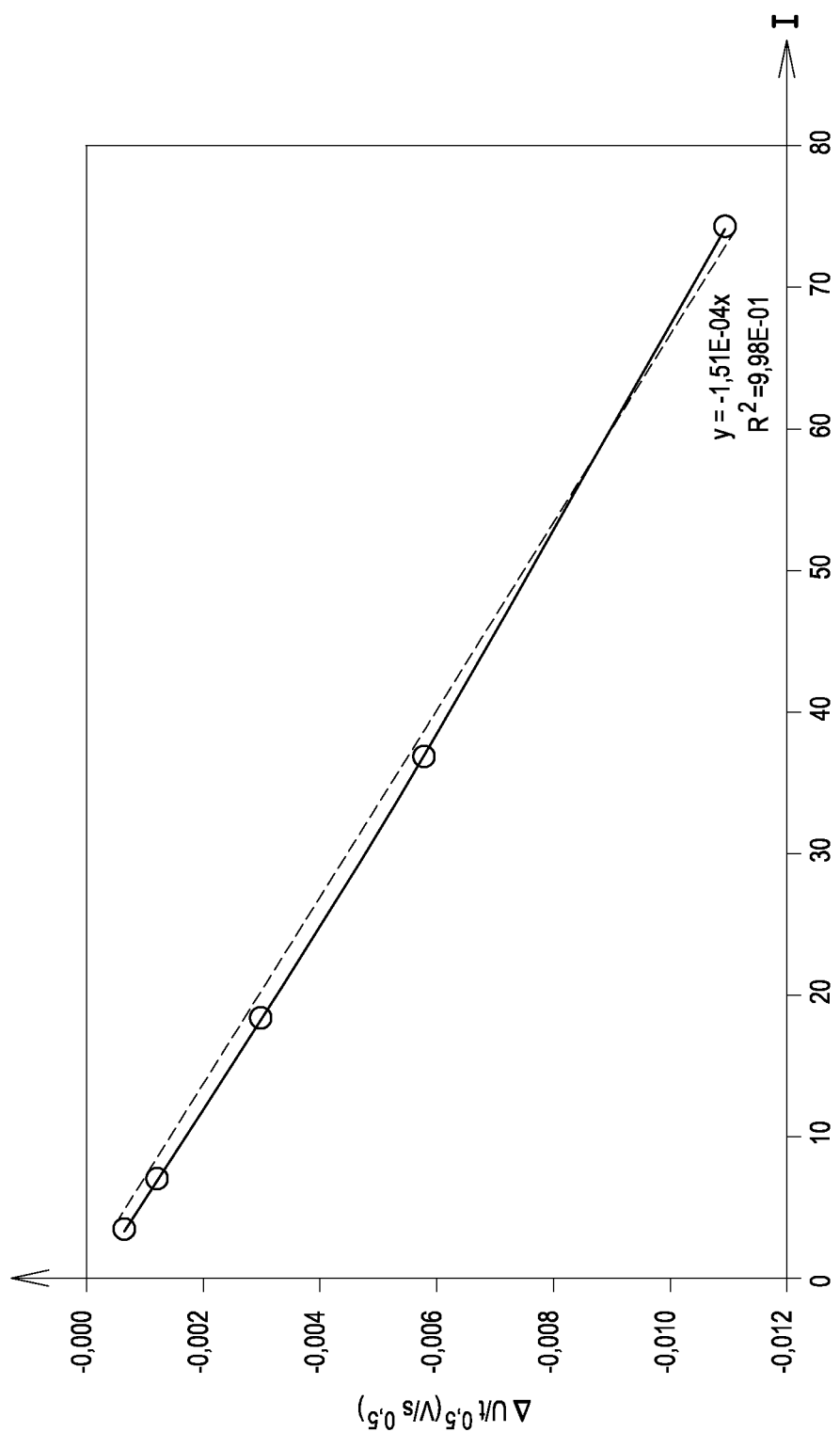
Figure 5:
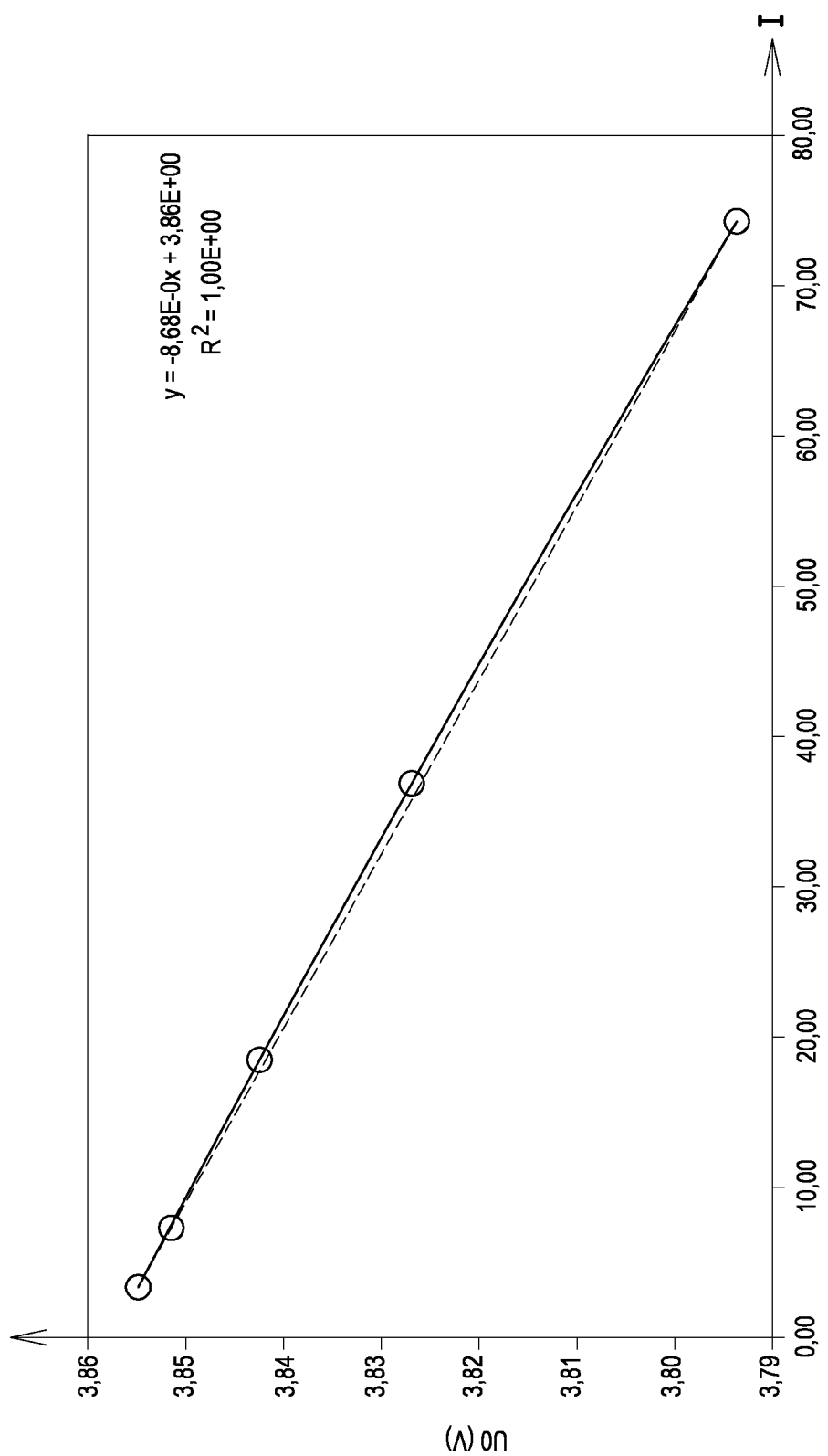
Figure 6:
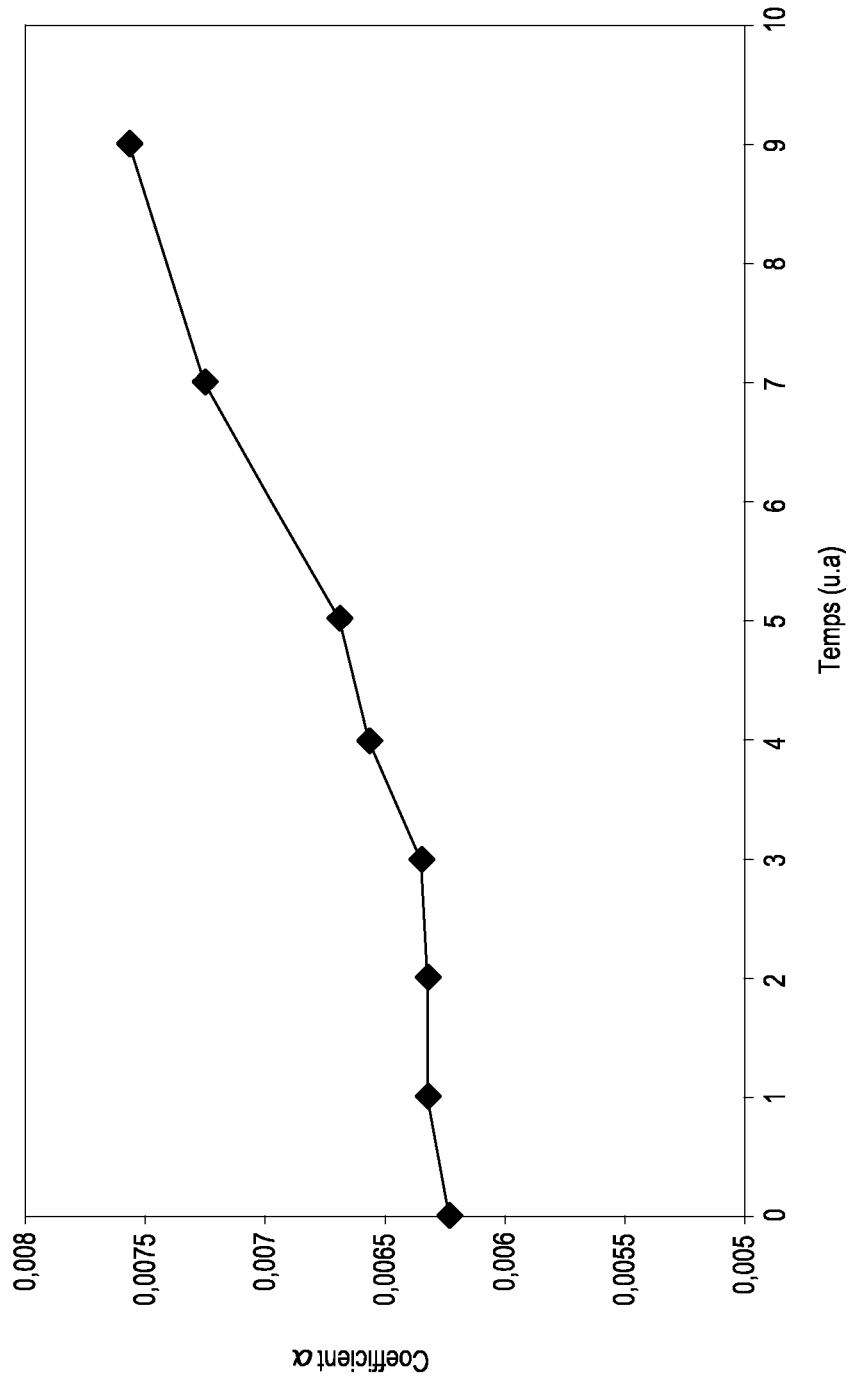
Figure 7:
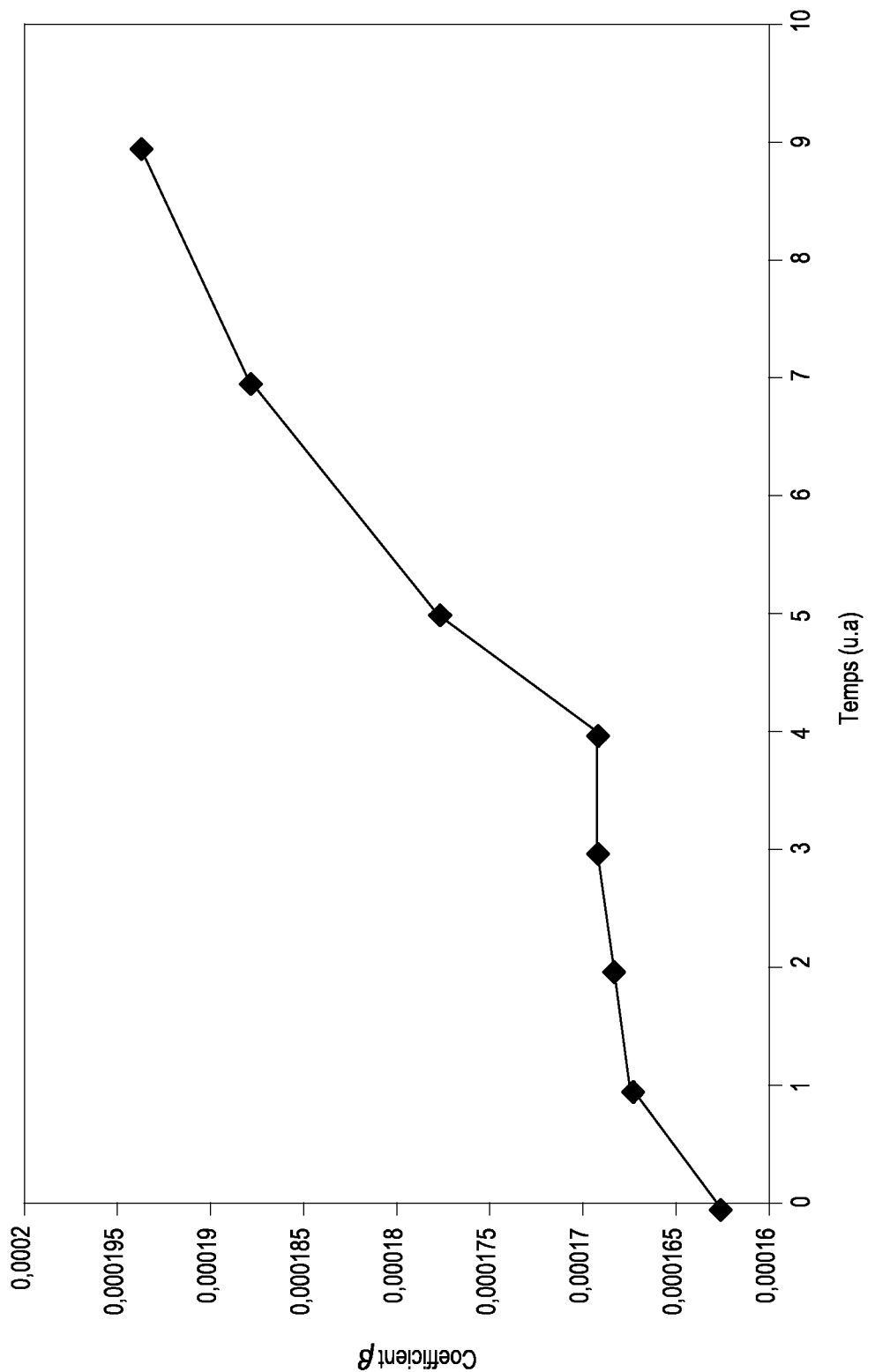
Figure 8:
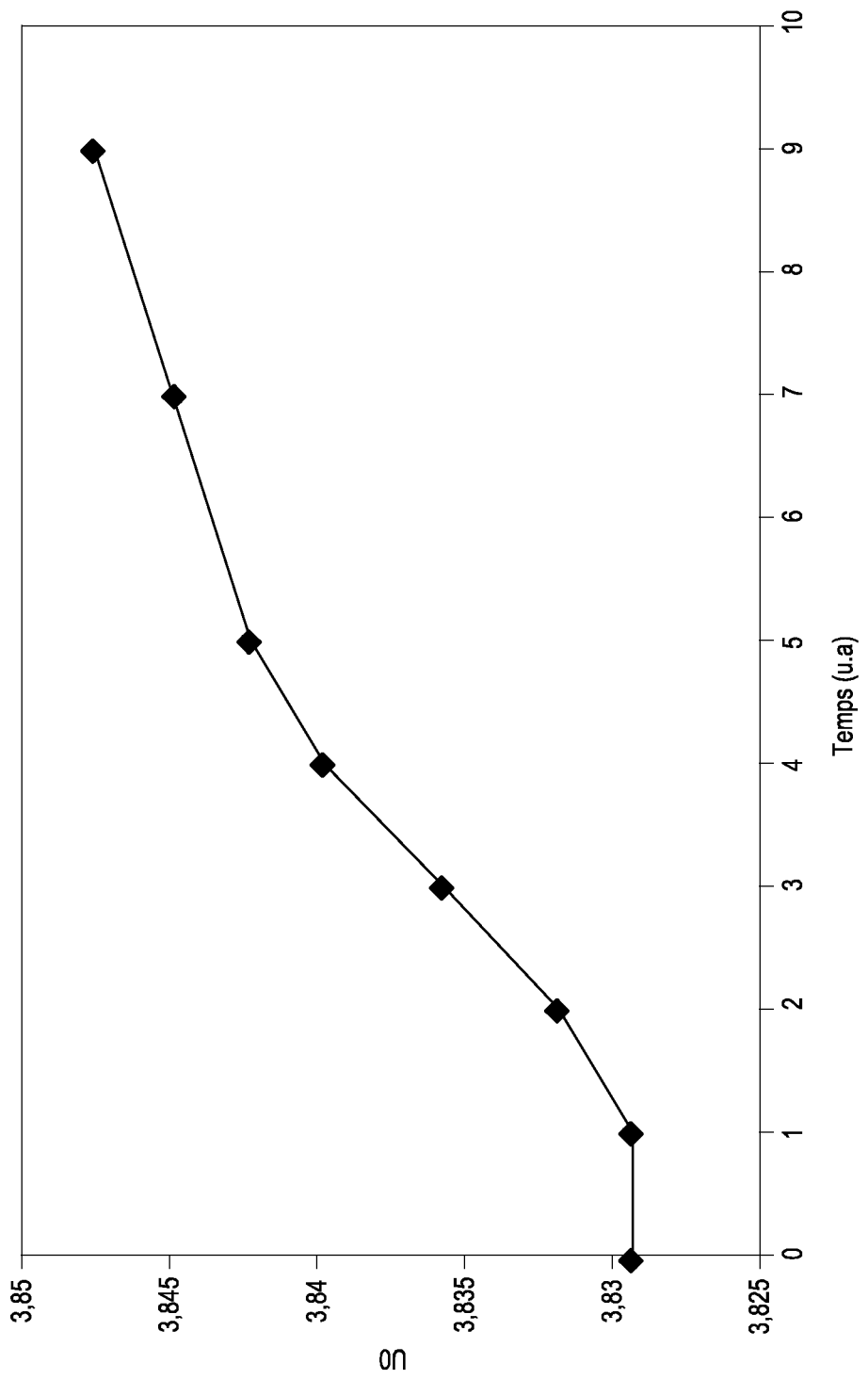
Figure 9:
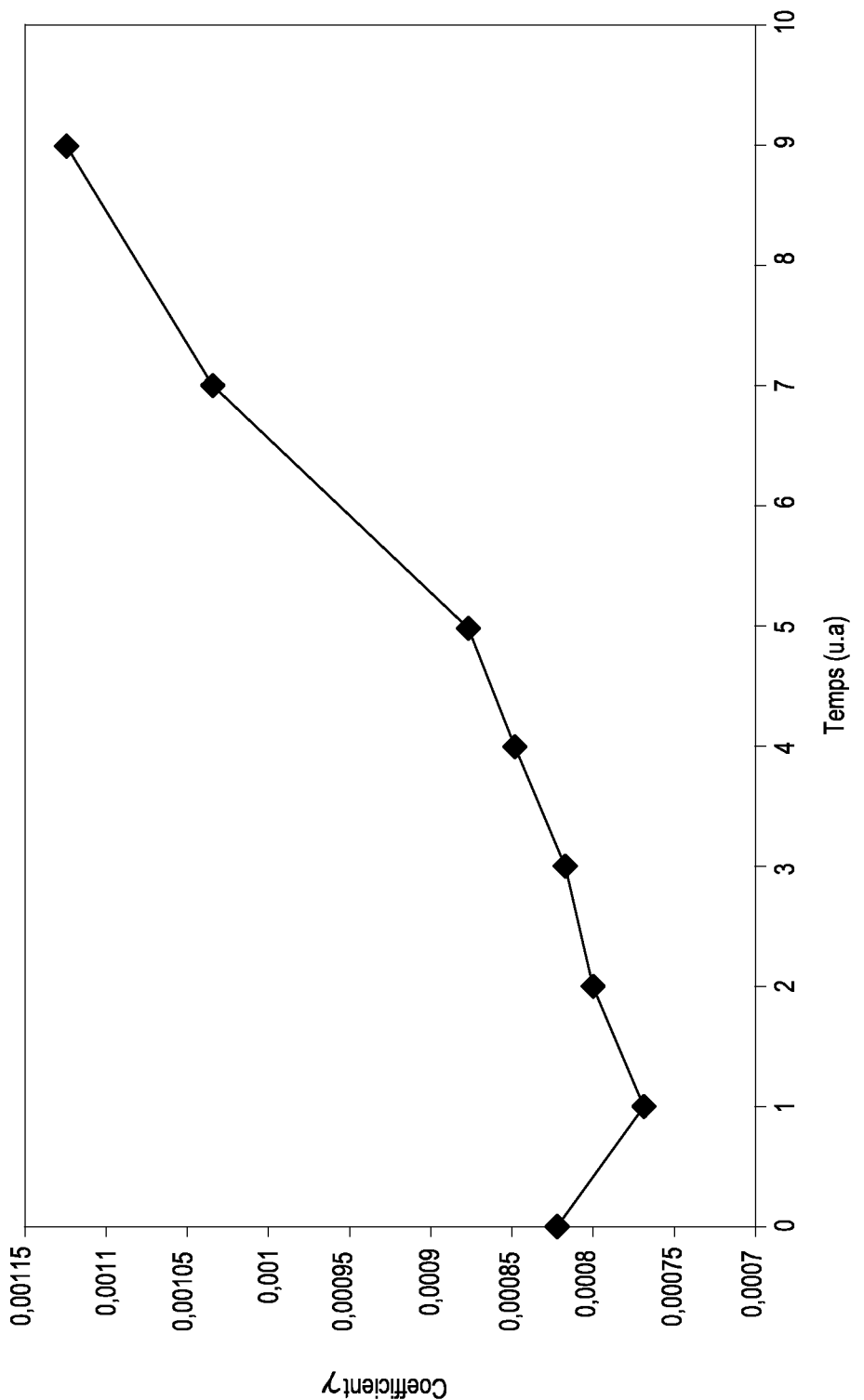

Other features and advantages of the invention will become apparent with the aid of the description that follows presented with regard to the appended drawings which show:

FIG. 1, with a graph, one example of variation as a function of time t, after application of a current peak of intensity, of the voltage U across the terminals of a Li-ion cell;

FIG. 2, with a graph, the variation of U as a function of $\sqrt{t}$;

FIG. 3, with a graph, various examples of variation of U as a function of $\sqrt{t}$ for various current peaks;

FIG. 4, with a graph, the variation of $\Delta U/\sqrt{t}$ as a function of the intensity I;

FIG. 5, with a graph, the variation as a function of I of a coefficient according to the invention;

FIGS. 6, 7, 8 and 9, graphs of aging according to the invention.

The present invention will calculate various coefficients characteristic of the state of health of a Li-ion cell.

As illustrated in the example of FIG. 1, the voltage U across the terminals of a Li-ion cell having a level of charge of the order of 40% can, after a current peak of intensity $I_1=74$ A (amps) has flowed through this cell at a time $t=0$, follow a variation from $t=0$ to $t=60$ seconds according to the graph illustrated in this figure. Using this simple curve representing the variation of U as a function of time t, it is possible according to the invention to extract various coefficients directly connected to the capacity of the cell to operate at high power density, this capacity being denoted "$SOH_P$" in the following part of the present application, by opposition to its capacity to operate at high energy density which will be denoted "$SOH_E$".

In the example in FIG. 1, the voltage across the terminals of the cell decreases from 3.86V at $t=0$ s down to 3.71V at $t=60$ s in a clearly non-linear manner. The initial voltage value at 3.86V corresponding to the voltage across the terminals of the cell in open circuit, in other words when there is no current flowing through the cell, this voltage being commonly denoted by the acronym OCV for "Open Circuit Voltage".

FIG. 2 illustrates, as a function of $\sqrt{t}$ rather than as a function of t, the variation over time of the same voltage U after the current peak of intensity $I_1$ has flowed through the cell. It is observed that, starting from $\sqrt{t}1$, the voltage decreases linearly as a function of $\sqrt{t}$, and indeed, one method of linearization shows that the variation of U as a function of $\sqrt{t}$ may be approximated, for $\sqrt{t} \geq 1$, by the straight line equation $U=\alpha_{I_1} \times \sqrt{t}+U_{0,I_1}$ with a slope $\alpha_{I_1}=-0.011$ and with an ordinate at the origin $U_{0,I_1}=3.7936$, these giving a correlation coefficient $R^2=0.9984$.

For a given current I, the slope $\alpha_I$ gives information on the $SOH_P$ of the cell, notably on its capacity to operate over long periods of time greater than 1 second at a given current.

For a given current I, the ordinate at the origin $U_{0,I}$ also gives information on the $SOH_P$ of the cell, in particular:
- the higher $U_{0,I}$ is with respect to the OCV, the less the cell is capable of operating at high power of the order of 100 to 1000 watts;
- a high ordinate at the origin $U_{0,I}$ with respect to the OCV can also indicate that the cell has a problem for short time periods, in other words at high frequencies, such as connection hardware or solder joint problems.

Optionally, it is possible to implement a strategy for diagnosing the state of health at several currents according to the present invention, as illustrated in FIGS. 3, 4 and 5 that follow, this strategy allowing a more refined diagnosis.

Indeed, FIG. 3 illustrates, as a function of $\sqrt{t}$, the variation over time of the voltage U across the terminals of the same cell having a level of charge of the order of 40%, not only after the current peak of intensity $I_1=74$ A has flowed through the cell, but also after 4 other peaks with respective intensities $I_2=37$ A, $I_3=18.5$ A, $I_4=7.4$ A and $I_5=3.7$ A have flowed through this same cell. Here again, irrespective of the peak in question, it is observed that, starting from $\sqrt{t}=1$, the voltage decreases linearly as a function of $\sqrt{t}$. The same method of linearization shows that the variations of the voltages as a function of $\sqrt{t}$ may be approximated, for $\sqrt{t} \geq 1$:

- after the peak of intensity $I_2$, by the straight line equation $U=\alpha_{I_2} \times \sqrt{t}+U_{0,I_2}$ with a slope $\alpha_{I_2}=-0.0058$ and with an ordinate at the origin $U_{0,I_2}=3.8268$, these giving a correlation coefficient $R^2=0.9981$;
- after the peak of intensity $I_3$, by the straight line equation $U=\alpha_{I_3} \times \sqrt{t}+U_{0,I_3}$ with a slope $\alpha_{I_3}=-0.003$ and with an ordinate at the origin $U_{0,I_3}=3.8424$, these giving a correlation coefficient $R^2=0.9989$;
- after the peak of intensity $I_4$, by the straight line equation $U=\alpha_{I_4} \times \sqrt{t}+U_{0,I_4}$ with a slope $\alpha_{I_4}=-0.0012$ and with an ordinate at the origin $U_{0,I_4}=3.8515$, these giving a correlation coefficient $R^2=0.9938$;
- after the peak of intensity $I_5$, by the straight line equation $U=\alpha_{I_5} \times \sqrt{t}+U_{0,I_5}$ with a slope $\alpha_{I_5}=-0.0007$ and with an ordinate at the origin $U_{0,I_5}=3.8546$, these giving a correlation coefficient $R^2=0.9652$.

On the one hand, FIG. 4 illustrates the variation over time of $\Delta U/\sqrt{t}$ as a function of the intensity I, for the values $I_1=74$ A, $I_2=37$ A, $I_3=18.5$ A, $I_4=7.4$ A and $I_5=3.7$ A in FIG. 3. It is observed that $\Delta U/\sqrt{t}$ decreases linearly with I, and indeed, one method of linearization shows that the variation of $\Delta U/\sqrt{t}$ as a function of I may be approximated by the straight line equation $\Delta U/\sqrt{t}=\beta \times I$ with a slope $\beta=-0.000151$ and with an ordinate of zero at the origin, these giving a correlation coefficient $R^2=0.998$.

The slope $\beta$ reveals the sensitivity of the cell to the current over long time constants, in other words diffusion phenomena. The slope $\beta$ indicates the capacity of the cell to operate at high currents: the higher the absolute value of the slope $\beta$, the more the cell is sensitive to the use of high currents.

On the other hand, FIG. 5 illustrates the variation over time of the ordinate at the origin $U_{0,I}$ of the curves illustrated in FIG. 3, as a function of the intensity I, for the values $I_1=74$ A, $I_2=37$ A, $I_3=18.5$ A, $I_4=7.4$ A and $I_5=3.7$ A in FIG. 3. It is observed that $U_{0,I}$ decreases linearly with I, and indeed, one method of linearization shows that the variation of $U_{0,I}$ as a function of I may be approximated by the straight line equation $U_{0,I}=\gamma \times I+OCV$ with a slope $\gamma=-0.000868$ and with an ordinate at the origin $OCV=3.86$, these giving a correlation coefficient $R^2=1$. As regards the slope $\gamma$, this corresponds to the internal resistance of the cell, which is therefore equal to 0.868 milliOhms (m$\Omega$) at this level of charge of 40% and which corresponds to an impedance measured at 3.5 Hertz (Hz).

Since it corresponds to the internal resistance of the cell, the slope $\gamma$ therefore also provides information on the $SOH_P$ of the cell: the steeper the slope $\gamma$, the more the $SOH_P$ of the cell is degraded. In a more precise manner than the ordinate at the origin $U_{0,I}$ as a function of the intensity I, the slope $\gamma$ estimated using the $U_{0,I}$ values provides information on the capacity of the cell to operate over short times, in other words at high frequencies. It provides information on the resistance of the cell at high frequencies which, if it is high, may be explained by a problem of connection hardware or of significant aging of the cell.

In the latter case, the coefficients $\alpha_1$ and $\beta$ should indicate aging. Hence, if the coefficients $\alpha_1$ and $\beta$ are acceptable and if the coefficient $\gamma$ is not, it may be deduced that the problem at high frequencies is due to a problem of connection hardware.

Once the coefficients $\alpha_1$, $\beta$, $U_{0,I}$ and $\gamma$ have been calculated according to the present invention, they may be used in various ways.

As previously described, a first way is to use them for the purposes of diagnosing the cell, in order to notably estimate its capacity to operate at high power, in other words to estimate its $SOH_P$, or even to diagnose a fault in connection hardware. For example, for $\alpha_1$, $\beta$ and $\gamma$, a ratio may be calculated between the value calculated at the current time and the value initially calculated, namely $\alpha_{I,BOL}$, $\beta_{BOL}$ and $\gamma_{BOL}$ respectively, where the abbreviation "BOL" denotes "Beginning Of Life". The relative variation of the ratios $\alpha_1/\alpha_{I,BOL}$, $\beta/\beta_{BOL}$ et $\gamma/\gamma_{BOL}$ over time may thus be observed: if a coefficient at a given moment is increasing too much with respect to its initial value, whereas the other coefficients show the expected variation over time, then the cell most probably has a connection hardware fault. It is also possible to observe ratios of the type $\gamma/\beta$ or $\gamma/\alpha_I$. In the example illustrated in the figures, during the life of the cell, the ratio $\gamma/\beta$ varies between 4.59 and 5.78. However, a connection hardware fault of 0.2 m$\Omega$ makes this variation go between 5.78 and 6.814, whereas a fault of 1 m$\Omega$ makes this variation go between 10.56 and 11.17. By making a prior estimation of these various values, it is possible to detect connection hardware problems at the beginning of life and during the life of the cell.

Another way of using them is to estimate the $SOH_E$ of the cell using tables or graphs of aging, such as the graphs illustrated in FIGS. 6, 7, 8 and 9 for the slope $\alpha_I$, the slope $\beta$, the ordinate at the origin $U_{0,I}$ and the slope $\gamma$, respectively. These graphs associate, with values of said coefficients, values in arbitrary units (a.u.), these values in arbitrary units characterizing the aging of a cell. For example, a value 0 on the abscissa characterizes the beginning of the life of the cell and a value 9 characterizes the end of the life of the cell. These graphs are filled out prior to using the cell, during campaigns for studying the process of aging of the cells throughout their life. Thus, according to FIG. 6, the slope $\alpha_I$ increases from substantially 0.0062 at the beginning of life of the cell up to substantially 0.0076 at the end of life of the cell. According to FIG. 7, the slope $\beta$ increases from substantially 0.000163 at the beginning of life of the cell up to substantially 0.000194 at the end of life of the cell. According to FIG. 8, the ordinate at the origin $U_{0,I}$ increases from substantially 3.829 at the beginning of life of the cell up to substantially 3.848 at the end of life of the cell. Finally, according to FIG. 9, the slope $\gamma$ firstly decreases from substantially 0.00082 to substantially 0.00077 at the beginning of life of the cell, before increasing up to substantially 0.00112 at the end of life of the cell.

Another way of using the coefficients $\alpha_I$, $\beta$, $U_{0,I}$ and $\gamma$ calculated according to the present invention is to compare one cell with another in a module or a pack comprising several cells, or else in such a manner as to compare the variation over time of various types of cells in the case of cells based on different chemistries or not coming from the same supplier.

The invention described hereinabove has the further main advantage that, since it only requires a software updating of the current devices for estimating the state of health, its cost of implementation is very low.

The invention claimed is:

1. A method for estimating a state of health of an electrochemical cell for storing electrical energy, the method comprising:
    applying to the cell at least one current peak of intensity $I_1$, the current peak flowing through the cell;
    measuring a variation, as a function of a time t that has passed after an application of the current peak, of a voltage U across terminals of the cell;
    calculating at least one coefficient $\alpha_{I_1}$ and at least one coefficient $U_{0,I_1}$ such that $U=\alpha_{I_1}\times\sqrt{t}+U_{0,I_1}$ is a linear approximation of the variation of the voltage U as a function of $\sqrt{t}$, where $\sqrt{t}\geq 1$;
    calculating a coefficient $\beta$ such that $-U/\sqrt{t}=\beta\times I$ is a linear approximation of a variation of $\Delta U/\sqrt{t}$ as a function of I, wherein a plurality of current peaks of intensities $(I_n)_{n\geq 2}$ are applied to the cell ($I_1$, $I_2$, $I_3$, $I_4$, $I_5$);
    estimating the state of health of the cell based on either of the coefficients calculated in the calculating; and
    detecting a fault with connection hardware of the cell when at least one of the coefficients is increasing above a predetermined amount with respect to a value of the coefficient at a beginning of life of the cell.

2. The method as claimed in claim 1, wherein, the coefficients $\alpha_{I_1}$ and $U_{0,I_1}$ having been calculated a first time at the beginning of life of the cell, the method further comprises:
    calculating a ratio of a value currently calculated of $\alpha_{I_1}$ with respect to its value calculated at the beginning of life, an increase of the coefficient $\alpha_{I_1}$ beyond a predetermined value of said ratio indicating an incapacity of the cell to deliver a current, and/or;
    calculating a ratio of a value currently calculated of $U_{0,I_1}$ with respect to its value calculated at the beginning of life, an increase in the coefficient $U_{0,I_1}$ beyond a predetermined value of said ratio indicating an incapacity of the cell to deliver the current.

3. The method as claimed in claim 1, wherein, tables or graphs of aging having been filled out beforehand, the method further comprises:
    comparing a value currently calculated of $\alpha_{I_1}$ with values contained in a table or a graph of aging associating levels of aging with values of $\alpha_{I_1}$, in such a manner as to deduce a level of aging of the cell, and/or;
    comparing a value currently calculated of $U_{0,I_1}$ with values contained in a table or a graph of aging associating levels of aging with values of $U_{0,I_1}$, in such a manner as to deduce the level of aging of the cell.

4. The method as claimed in claim 1, wherein, the coefficient $\beta$ having been calculated a first time at the beginning of life of the cell, the method further comprises:
    calculating a ratio of a value currently calculated of $\beta$ with respect to its value calculated at the beginning of life, an increase in the coefficient $\beta$ beyond a predetermined value of said ratio indicating an incapacity of the cell to deliver a current.

5. The method as claimed in claim 1, wherein, tables or graphs of aging having been filled out beforehand, the method further comprises:
    comparing a value currently calculated of $\beta$ with values contained in a table or a graph of aging associating levels of aging with values of $\beta$, in such a manner as to deduce the level of aging of the cell.

6. The method as claimed in claim 1, further comprising:
    calculating a coefficient $\gamma$ such that $-U_{0,I_1}=\gamma\times I+OCV$, where OCV is an open circuit voltage of the cell, is a linear approximation of the variation of $U_{0,I}$ as the function of I.

7. The method as claimed in claim 6, wherein, the coefficient $\gamma$ having been calculated a first time at the beginning of life of the cell, the method further comprises:
  calculating a ratio of a value currently calculated of $\gamma$ with respect to its value calculated at the beginning of life of the cell, an increase in the coefficient $\gamma$ beyond a predetermined value of said ratio indicating an incapacity of the cell to deliver a current.

8. The method as claimed in claim 7, wherein, tables or graphs of aging having been filled out beforehand, the method further comprises:
  comparing the value currently calculated of $\gamma$ with values contained in a table or a graph of aging associating levels of aging with values of $\gamma$, in such a manner as to deduce the level of aging of the cell.

\* \* \* \* \*